Dec. 13, 1960 E. I. DOUCETTE ET AL 2,964,648

SEMICONDUCTOR CAPACITOR

Filed Dec. 24, 1958

INVENTORS: E. I. DOUCETTE
C. J. SPECTOR

BY H. W. Lockhart

ATTORNEY 2,964,648

SEMICONDUCTOR CAPACITOR

Edward I. Doucette, Summit, and Clarence J. Spector, Gillette, N.J., assignors to Bell Telephone Laboratories, Incorporated, New York, N.Y., a corporation of New York Filed Dec. 24, 1958, Ser. No. 782,778

4 Claims. (Cl. 307—88)

This invention relates to semiconductor capacitors and, more particularly, to a semiconductor variable capacitor.

It is well known that a semiconductor PN junction exhibits capacitance as a result of the dielectric effect of the depletion layer existing on both sides of the PN boundary. This depletion layer, or space charge region, exists as a result of the impurity content and distribution in the semiconductor material and is altered by the application of a potential across the PN junction. The application of an increasing voltage in the reverse direction across the junction results in an enlargement of the thickness of the depletion layer.

As in a conventional capacitor, the capacitance of the semiconductor PN junction is directly proportional to the area of one boundary of the depletion layer and inversely proportional to its thickness. Thus, the conventional semiconductor PN junction device has a capacitance-voltage characteristic based on the change in the depletion layer thickness with changes in the reverse bias applied across the semiconductor diode. In accordance with this invention, at least one surface of the semiconductor diode is shaped so as to produce a relatively abrupt change in the effective area of the capacitor associated with the depletion layer. Thus, with a relatively small change in bias voltage there results a comparatively large change in the capacitance exhibited across the device.

Therefore, one broad object of this invention is an improved semiconductor capacitor.

A more specific object is a semiconductor capacitor having a capacitance-voltage characteristic which departs significantly from the similar characteristic of previously known semiconductor PN junctions.

More specifically, an object of this invention is a semiconductor capacitor having a capacitance-voltage characteristic which exhibits abrupt changes in capacitance with relatively small changes in bias.

One specific embodiment in accordance with this invention comprises a semiconductor PN junction diode in the form of a thin circular wafer or disc having a PN junction parallel to the major faces of the disc. One major face of the disc contains a concentric annular trench substantially rectangular in cross section and having a depth to a point approaching but not intersecting the junction. In one form the invention is realized by applying separate low resistance electrodes to the central portion of the face containing the trench and to the opposite face of the body. The semiconductor disc of the device of this invention resembles that of the field effect resistor disclosed in the application of E. I. Doucette, H. A. Stone, Jr. and R. M. Warner, Jr., Serial No. 700,319, filed December 3, 1957. However, there are significant differences in the structure and design of the variable capacitor and the field effect resistor as well as in the purposes and mode of operation. In the field effect resistor, electrodes are applied on both sides of the trench to one conductivity-type region whereas in the variable capacitor one electrode is applied to each region on both sides of the junction, the electrode to the trenched region being applied to the central portion within the trench. Furthermore, the design factors for the capacitor and resistor differ significantly. For the capacitor the ratio of the area circumscribed by the trench to the total area is significant, whereas in the field effect resistor this ratio is unimportant but the trench dimensions of width, depth and length are of particular importance.

The specific structure thus described provides a unique variation in the capacitance exhibited across the terminals of the diode as a result of the effect of the particular geometry of the semiconductor body upon the growth of the depletion layer as the bias voltage is changed. At a low value of reverse bias the depletion layer boundaries are close to the PN junction and the entire cross-sectional area of the disc constitutes the active area of the capacitor. As the bias voltage is increased in the reverse direction, the depletion layer boundary moves away from the junction and at a given value intersects the boundaries of the trench in the one region. At this point, the area of the effective capacitance of the diode decreases substantially to that defined within the boundaries of the trench with some additional varying capacitance of the area outside of the trench as effected through the resistance of the pinch-off region. Thus, from this value of bias voltage onward in the reverse direction the capacitance voltage relation, to a considerable extent, is that of the smaller area capacitor. It is therefore possible to provide variable capacitance diodes having an abrupt step in their capacitance-voltage characteristic, which step may be predetermined by the dimensioning of the semiconductor body geometry. In this connection the pinch-off region refers to the portion of the body adjacent the bottom of the trench when the bias voltage has reached a value such that the depletion layer intersects the boundary of the trench. This condition, similarly, is termed "pinch-off." Therefore, one feature of this invention is a PN junction diode having an annular trench in one conductivity-type region and having separate low resistance electrodes to the central portion within the trench of the one region and to the other conductivity-type region.

A further feature of the PN junction capacitance device in accordance with this invention is a closed continuous trench in one conductivity-type region having a depth approaching but not intersecting the junction.

The invention and its other objects and features will be better understood from the following detailed description taken in connection with the drawing in which.

Figures 1, 2:
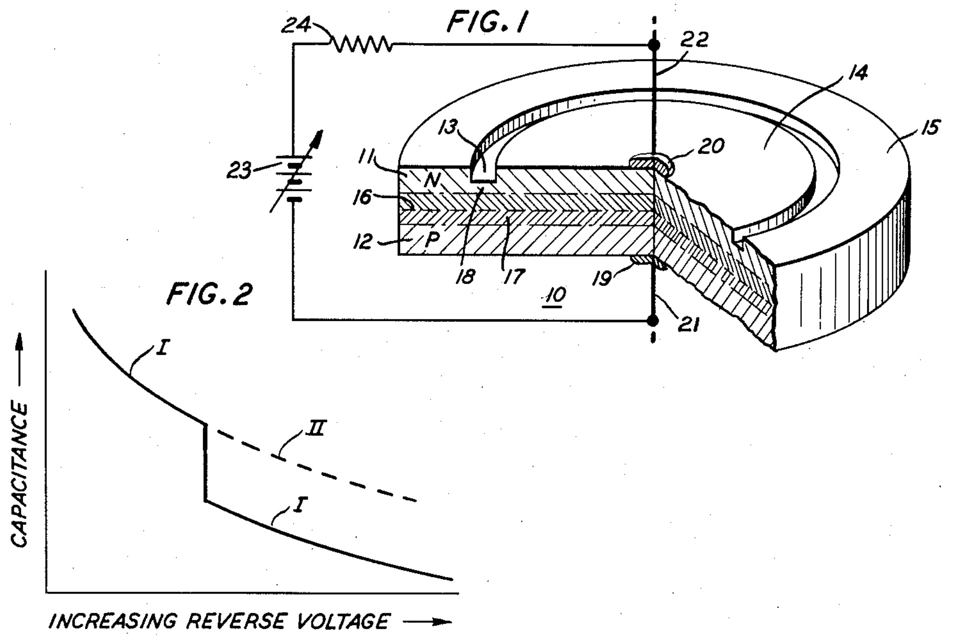
Fig. 1 is a perspective view, partially in section, of one embodiment of the variable capacitance diode in accordance with this invention.
Fig. 2 is a graph showing a typical capacitance-voltage characteristic for the diode of Fig. 1.

Turning to Fig. 1, the semiconductor diode comprises a disc of silicon produced from single crystal silicon by crystal growing and shaping techniques well known in the art. For example, for providing such a disc, a slice of single crystal silicon having a thickness of about .010 inch and of N-type conductivity was first subjected to a heat treatment at about 1300 degrees for about 12 hours following the application of a coating on one surface of a solution composed of boron oxide in ethylene gycol monomethyl ether. This produced a PN junction at a depth of .003 inch from the coated surface. The slice was then lapped mechanically to a total thickness of .0056 inch with the PN junction located .0028 inch from both major faces. Using ultrasonic cutting, the slice was then divided into a number of round wafers or discs, each of the kind shown as the semiconductor body 10 of Fig. 1. As shown therein, the body 10 comprises an N-type region 11 and a P-type region 12 defining a junction 16 therebetween. Again, using ultrasonic cutting means, an annular trench 13 having a width of about .004 inch and a depth of .0015 inch was cut in the N-type face of the body as shown. Final processing included chemical treatment to increase the depth of the trench to yield the optimum electrical characteristics. To this end the body was etched in a CP-4 etch without bromine to increase the trench depth to approximately .002 inch, at which point the capacitance characteristic showed a step at 5 volts. Low resistance electrodes were then applied by conventional plating and soldering techniques to provide the contact 19 to the P-type region and contact 20 to the central portion within the trench of the N-type region.

A source of variable direct current voltage 23 for biasing the diode in the reverse direction is connected to leads 21 and 22. An isolating resistor 24 also is connected in this circuit to inhibit the passage of alternating signal current through the direct current bias source. Alternative modes of providing such isolation by suitable arrangement of capacitors likewise may be used.

As shown in the sectioned portion of Fig. 1, there is a depletion layer indicated by the shaded region 17 associated with the PN junction on both sides thereof. This depletion layer exists initially as a result of the impurity distribution within the two conductivity-type regions of the semiconductor body. The application of a voltage in the reverse direction across the electrodes 19 and 20 produces an enlargement of this depletion layer. Initially, the variation in capacitance with change in voltage arises from the change in the thickness of the depletion layer and may be considered as represented by the upper portion of the curve I in the graph of Fig. 2. In the conventional PN junction diode, the capacitance-voltage relation would continue along the curve shown as a broken line and denoted II. However, as the depletion layer enlarges it intersects the bottom of the trench 13 and at that point the effective area of the capacitor becomes substantially the area defined within the central portion 14 of the N-type region 11 with some additional capacitance of the peripheral portion as effected through the resistance of the pinch-off region. At this value of voltage, therefore, the capacitance drops relatively abruptly, as depicted by the step in the curve I, and from thence exhibits a capacitance-voltage relation represented by the lower portion of curve I. Thus, there is realized a variable capacitance diode having a very abrupt step or change in capacitance at a particular bias voltage. It will be appreciated that the location of this step may be controlled to a considerable extent by controlling the thickness dimension of the channel 18 between the bottom of the trench 13 and the junction 16 and by control of the impurity distribution. It will also be appreciated that this device is, to some extent, limited in the frequency of the applied signal which may be passed because of the effective resistance of the pinch-off region as it is associated with the two variable capacitances which are effectively connected in parallel after the reverse bias voltage has risen to the value which results in pinch-off by depletion layer penetration.

Figure 3:
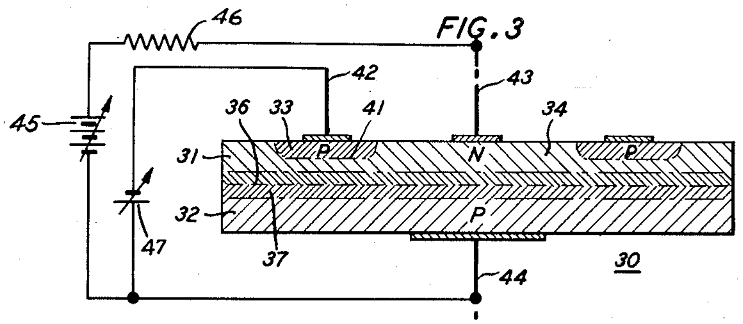
Fig. 3 is a diagram in cross section of another embodiment of the invention.

The embodiment of Fig. 3 illustrates a variable capacitance element having a third low resistance control connection 42 formed by an additional P-type region 33 which replaces the trench portion of the device of Fig. 1. Such an annular conductivity-type region may be produced by masking and diffusing techniques now well known in the art and disclosed, for example, in the application of J. Andrus, Serial No. 678,411, filed August 15, 1957.

Similarly to the embodiment of Fig. 1, there is provided a variable source of biasing voltage 45 and an isolating resistor 46. In addition, another variable voltage source 47 is included for separately controlling the bias across the PN junction of the added P-type region 33.

Figure 4:
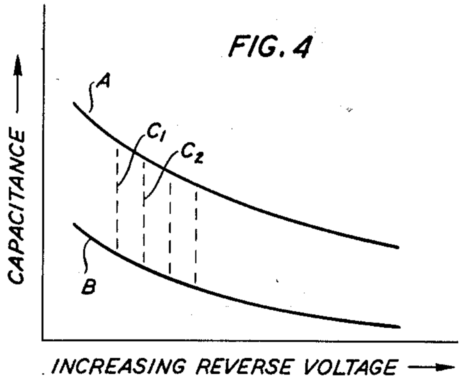
Fig. 4 is a graph illustrating the capacitance-voltage characteristics of the embodiment of Fig. 3.

The mode of operation of the embodiment of Fig. 3 will be understood from a consideration of the graph of Fig. 4 wherein are shown two curves in solid lines A and B. The curve A represents the capacitance-voltage characteristic for a capacitor represented by the depletion layer extending the entire cross section of the semiconductor disc and the curve B is the corresponding characteristic for a capacitor having an area corresponding to the cross section of the central portion 34. The series of curves $C_1$, $C_2$, et cetera, represent the various steps realizable by the application of a control voltage to the third terminal 42. Thus, the application of a particular reverse bias between the terminals 42 and 43 will determine the extent of the depletion layer associated with the PN junction 41. The extent of this depletion layer interacting with the boundary of the major depletion layer 37 will determine the particular point at which the device changes from an effective capacitance having an area based on the entire cross section of the disc to one based on the cross section within the central portion 34 of the N-type region 31. Thus, the addition of a third or control region of the variable capacitance diode provides a semiconductor device having extremely advantageous control of the capacitance characteristic.

Although the invention has been disclosed in terms of certain specific embodiments, it will be understood that these are but illustrative and that other arrangements may be devised by those skilled in the art which also will be within the scope and spirit of the invention. For example, more than one concentric annular trench may be provided each having a lesser depth as the center is approached. Such a device would exhibit a characteristic having a number of step changes, generally, one for each trench.

What is claimed is:

1. A semiconductor device for use as a variable capacitor comprising a body of semiconductor material, said body including a P-type conductivity region and an N-type conductivity region, said regions defining a PN junction therebetween, one of said regions having a central portion and a peripheral portion, said peripheral and central portions being separated by a portion of reduced thickness, a first substantially ohmic connection to the central portion of said one conductivity-type region, a second substantially ohmic connection to said other region, said peripheral portion being free of any connection, whereby with increasing potential in the reverse direction across said PN junction the depletion layer in said one region occupies all of the portion of reduced thickness thereby electrically isolating the depletion layer boundary in the central portion from said boundary in the peripheral portion.

2. A semiconductor device for use as a variable capacitor comprising a wafer of semiconductor material having two opposed major faces, said wafer having a region of P-type conductivity adjacent one face and a region of N-type conductivity adjacent the other face, said regions defining a PN junction therebetween, one of said regions having a continuous trench in the major face thereof, said trench dividing said one region into a central portion and a peripheral portion, a first substantially ohmic connection to the central portion of said one region, a second substantially ohmic connection to said other region, said peripheral portion being free of any connection, whereby with increasing potential in the reverse direction across said PN junction the depletion layer in said one region occupies all of the portion of reduced thickness thereby electrically isolating the depletion layer boundary in the central portion from said boundary in the peripheral portion.

3. A semiconductor device for use as a variable capacitor comprising a wafer of semiconductor material having two opposed major faces, said body having a region of P-type conductivity adjacent one face of a region of N-type conductivity adjacent the other face, said regions defining a substantially planar PN junction therebetween, one of said regions having a continuous trench in the face thereof dividing said region into a central portion and a peripheral portion, said trench having a depth approaching but not intersecting said junction, a first substantially ohmic connection to the central portion of said one region, a second substantially ohmic connection to said other region, said peripheral portion being free of any connection, whereby with increasing potential in the reverse direction across said PN junction the depletion layer in said one region occupies all of the portion of reduced thickness thereby electrically isolating the depletion layer boundary in the central portion from said boundary in the peripheral portion.

4. A semiconductor device comprising a disc of semiconductor material having two opposed major faces, said body having a region of P-type conductivity adjacent one face and of N-type conductivity adjacent the other face, said regions defining a PN junction therebetween, one of said regions containing a concentric annular trench in the major face thereof separating said one region into a central portion and a peripheral portion, said trench having a depth approaching but not intersecting said junction, a first substantially ohmic connection to the central portion of said one region, a second substantially ohmic connection to said other region, said peripheral portion being free of any connection, whereby with increasing potential in the reverse direction across said PN junction the depletion layer in said one region occupies all of the portion of reduced thickness thereby electrically isolating the depletion layer boundary in the central portion from said boundary in the peripheral portion.

References Cited in the file of this patent

UNITED STATES PATENTS

| | | |
|---|---|---|
| 2,600,500 | Haynes et al. | June 17, 1952 |
| 2,672,528 | Shockley | Mar. 16, 1954 |
| 2,761,020 | Shockley | Aug. 28, 1956 |
| 2,805,347 | Haynes et al. | Sept. 3, 1957 |
| 2,836,776 | Ishikawa et al. | May 27, 1958 |
| 2,884,607 | Uhlir | Apr. 28, 1959 |